United States Patent
Zhang et al.

(10) Patent No.: US 10,031,378 B2
(45) Date of Patent: Jul. 24, 2018

(54) ARRAY SUBSTRATE, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xinxia Zhang, Beijing (CN); Songnan Chu, Beijing (CN); Fengzhen Lv, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 27 days.

(21) Appl. No.: 14/435,896

(22) PCT Filed: Aug. 29, 2014

(86) PCT No.: PCT/CN2014/085520
§ 371 (c)(1),
(2) Date: Apr. 15, 2015

(87) PCT Pub. No.: WO2015/154369
PCT Pub. Date: Oct. 15, 2015

(65) Prior Publication Data
US 2016/0246128 A1    Aug. 25, 2016

(30) Foreign Application Priority Data
Apr. 9, 2014 (CN) .......................... 2014 1 0140645

(51) Int. Cl.
*G02F 1/1343* (2006.01)
*G02F 1/1362* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS 5,907,379 A      5/1999  Kim et al.
2009/0073365 A1*  3/2009  Jeon ................. G02F 1/134363
                                                        349/139
(Continued)

FOREIGN PATENT DOCUMENTS

CN    102087448 A    6/2011
CN    201974610 U    9/2011
(Continued)

OTHER PUBLICATIONS

First Chinese Office Action Appln. No. 201410140645.4; dated Jan. 25, 2016.
(Continued)

*Primary Examiner* — Cuong B Nguyen
*Assistant Examiner* — Samuel Park
(74) *Attorney, Agent, or Firm* — Ladas & Parry LLP

(57) ABSTRACT

An array substrate, a display panel and a display device are disclosed. The array substrate includes a plurality of pixel areas defined by a plurality of gate lines intersecting a plurality of data lines. Each pixel area includes: a pixel electrode (2), strip-shaped common electrodes (3) which cooperate to generate electric fields with the pixel electrode (2), and an insulating layer (4) disposed between the pixel electrode (2) and strip-shaped common electrodes (3). The strip-shaped common electrodes (3) are only disposed over
(Continued)

the pixel electrode (2) to reduce coupling capacitance formed between the data line and the common electrodes.

20 Claims, 2 Drawing Sheets

(51) Int. Cl.
G02F 1/1368 (2006.01)
H01L 27/12 (2006.01)
G02F 1/136 (2006.01)

(52) U.S. Cl.
CPC ...... *G02F 1/136286* (2013.01); *H01L 27/124* (2013.01); *G02F 2001/13606* (2013.01); *G02F 2001/134318* (2013.01); *G02F 2201/122* (2013.01)

(56) References Cited

U.S. PATENT DOCUMENTS

| 2011/0156995 | A1* | 6/2011 | Choi | G02F 1/134363 345/92 |
| 2013/0032827 | A1* | 2/2013 | Moon | G02F 1/136286 257/88 |
| 2013/0105831 | A1* | 5/2013 | Li | G02F 1/134309 257/88 |
| 2013/0314636 | A1* | 11/2013 | Chen | G02F 1/1343 349/43 |
| 2014/0124800 | A1 | 5/2014 | Um et al. | |
| 2015/0185565 | A1* | 7/2015 | Park | G02F 1/134363 349/43 |
| 2015/0212380 | A1* | 7/2015 | Chen | G02F 1/136286 349/42 |

FOREIGN PATENT DOCUMENTS

| CN | 102629039 A | 8/2012 |
| CN | 102937768 A | 2/2013 |
| CN | 102967971 A | 3/2013 |
| CN | 103941453 A | 7/2014 |
| KR | 101018558 B1 | 3/2011 |

OTHER PUBLICATIONS

International Search Report Appln. No. PCT/CN2014/085520; dated Jan. 19, 2015.
Written Opinion of the International Searching Authority Appln. No. PCT/CN2014/085520; dated Jan. 19, 2015.
Second Chinese Office Action dated Sep. 2, 2016; Appln. No. 201410140645.5.

* cited by examiner

ARRAY SUBSTRATE, DISPLAY PANEL AND DISPLAY DEVICE

TECHNICAL FIELD

Embodiments of the present invention relate to an array substrate, a display panel, and a display device.

BACKGROUND

Thin film transistor liquid crystal displays (TFT-LCDs) have been found in a wide range of applications in various fields, such as home, public places, work places, personal electronic products, etc. Since liquid crystal displays based on the Hyperplane Advanced Super Dimension Switch (HADS) technology have the advantages of high resolution, high transmittance, low power consumption, wide viewing angle, high opening ratio, low chromatic aberration, no push Mura, etc., they have been used more frequently. In a HADS mode liquid crystal display device, a multi-dimensional electric field is formed by an electric field produced at edges of slit electrodes in the same plane and an electric field produced between a slit electrode layer and a plate electrode layer, so that liquid crystal molecules at all orientations, including those located between slit electrodes and those located directly above the electrodes in a liquid crystal cell, can be rotated, which enhances the work efficiency of the liquid crystal, increases light transmittance and thus greatly improves the picture quality of TFT-LCD products.

In existing HADS mode TFT-LCDs, a common electrode and a pixel electrode are made of transparent conductor to increase the opening ratio and transmittance. The space between the common electrode and the pixel electrode is smaller than that between the upper and lower substrates, such that a fringing electric field is produced between the common electrode and the pixel electrode, and the liquid crystal molecules can be rotated in a plane parallel with the substrates and thus increase the light transmittance of the liquid crystal layer.

As illustrated in FIG. 1, in a known HADS mode TFT-LCD, a strip-shaped common electrode P3 is disposed over a pixel electrode P2 and parallel with a data line P1. A coupling capacitance is formed between the strip-shaped common electrode P3 and the data line P1, which may add a load to the data line, leading to a great increase of power consumption of the whole liquid crystal panel and adverse effects such as greenish display, crosstalk and so on.

SUMMARY

In the first aspect, an array substrate is provided, comprising a plurality of pixel areas defined by a plurality of gate lines intersecting a plurality of data lines, each pixel area comprising: a pixel electrode, strip-shaped common electrodes that are configured to cooperate with the pixel electrode to generate electric field, as well as an insulating layer disposed between the strip-shaped common electrodes and the pixel electrode, the strip-shaped common electrodes are only disposed over the pixel electrode.

In an example, the strip common electrodes extend in the same direction as the data line.

In an example, a distance between two of the strip-shaped common electrodes which are nearest to and on both sides of the data line is from 11 microns to 18 microns.

In an example, the strip-shaped common electrodes are arranged at equal intervals in each pixel area.

In an example, the above-mentioned array substrate further comprises a resin layer disposed between the data line and the strip-shaped common electrodes.

In an example, the data line and the pixel electrodes are disposed in the insulating layer, and the resin layer is disposed between the insulating layer and the strip-shaped common electrodes.

In an example, the pixel electrode is disposed in the insulating layer, the data line is disposed in the resin layer, and the insulating layer is disposed between the resin layer and the strip-shaped common electrodes.

In an example, the above-mentioned array substrate further comprises a thin film transistor (TFT) disposed in the pixel area, wherein a gate of the TFT is disposed in the same layer as a gate line, and a source and a drain of the TFT are disposed in the same layer as the data line.

In the second aspect, a display panel comprising the above-mentioned array substrate is provided.

In the third aspect, a display device comprising the above-mentioned display panel is provided.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

P1, 1—data line; P2, 2—pixel electrode; P3, 3—common electrode; 4—insulating layer; 5—resin layer.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the embodiments to be described are only some, not all, of the embodiments of the present invention. Based on the described embodiments herein, those skilled in the art can obtain other embodiment(s), without any inventive work, which should be within the scope of the invention.

Figure 1:
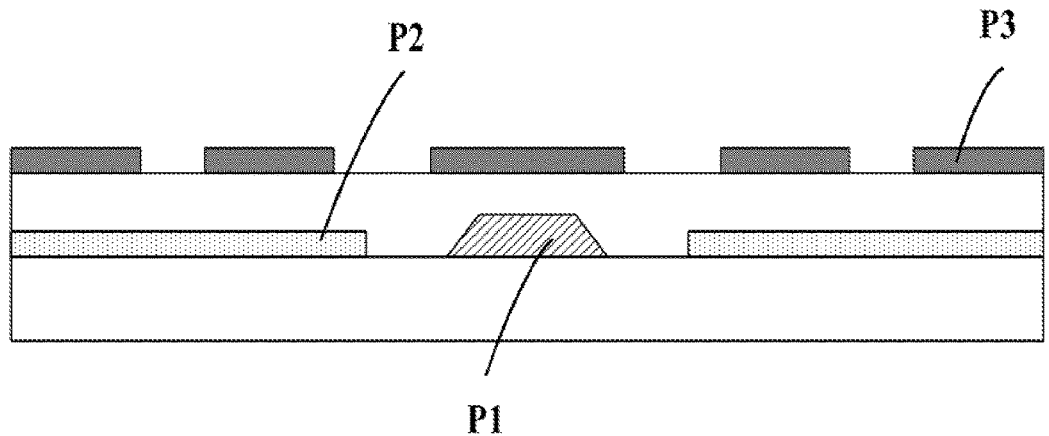
FIG. 1 is a schematic diagram illustrating a cross sectional structure of a known array substrate.
Figure 2:
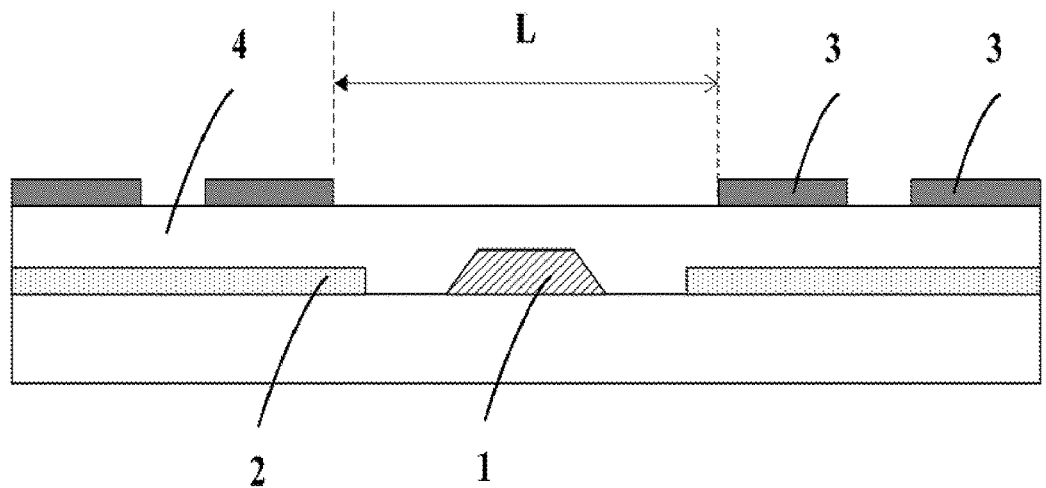
FIG. 2 is a schematic diagram illustrating a cross sectional structure of an array substrate provided in an embodiment of the present invention.

Referring to FIG. 2, an embodiment of the present invention provides an array substrate, which comprises a plurality of pixel areas defined by a plurality of gate lines (not shown) intersecting a plurality of data lines 1. A pixel electrode 2 and a strip-shaped common electrode 3 are disposed in each pixel area, and an insulating layer is disposed between the pixel electrode 2 and the strip-shaped common electrode 3. The strip-shaped common electrode 3 and pixel electrode are cooperated to generate an electric field. The strip-shaped common electrode 3 is only disposed over the pixel electrode 2. The insulating layer 4 is typically a transparent layer. In FIG. 1, the data line P1 is completely covered by the common electrode P3, leading to an excessive load on the data line P1, and the capacitance between the common electrode P3 and the covered data line P1 makes the biggest contribution to power consumption, leading to a great increase of power consumption of the whole liquid crystal panel. In the embodiment of the present invention, the strip-shaped common electrode is only disposed corresponding to the pixel electrode and no common electrode is disposed over the data line, so that the coupling capacitance between the strip-shaped common electrode and the data line are reduced.

In an example, the strip-shaped common electrode 3 extends in the same direction as the data line 1. It is favorable for reducing the coupling capacitance to make the common electrode 3 and the data line 1 extending in the same direction.

In an example, considering the influence of electric field at edges of the electrodes on light transmittance, a distance L between two strip-shaped common electrodes 3 which are nearest to and on both sides of the data line 1 is from 11 microns to 18 microns.

In an example, the strip-shaped common electrodes 3 are arranged at equal intervals (e.g. the interval is equal to the distance L) in each pixel area. With the arrangement of equal intervals, a uniform electric field can be generated, so that better optical characteristics can be achieved.

Figure 3:
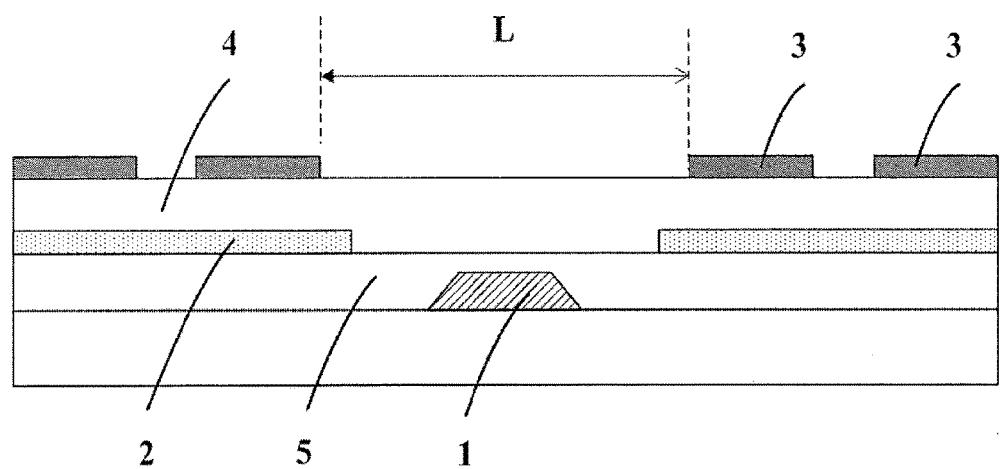
FIG. 3 is a schematic diagram illustrating a cross sectional structure of another array substrate provided in an embodiment of the present invention.

Referring to FIG. 3, reference numerals therein give the same indications as those in the array substrate illustrated in FIG. 2. The array substrate illustrated in FIG. 3 is different from that of FIG. 2 in that: a resin layer 5 is disposed between the data line 1 and the common electrodes 3 to protect the electric field from being disturbed by the data line 1. Therefore, the data line 1 and the pixel electrode 2 in FIG. 3 are formed in different layers, which is different from the situation of FIG. 2 where the data line 1 and the pixel electrode 2 are formed in the insulating layer 4. The data line 1 is formed in the resin layer 5, whereas the pixel electrode 2 is formed in the insulating layer 4 with the insulating layer 4 being disposed between the strip-shaped common electrodes 3 and the resin layer 5. The resin layer 5 is typically a transparent layer made of resin materials. The resin materials have low dielectric constant and a relatively large thickness, so that the adverse impacts of data line 1 on the electric field of the liquid crystal can be reduced significantly.

In an example, the resin layer 5 may also be disposed between the insulating layer 4 and the strip-shaped common electrode 3 in FIG. 2. However, the resin layer 5 in FIG. 3 is more effectively to reduce the disturbance caused by the data line 1 on the electric field of the liquid crystal without influencing the storage capacitances between the common electrodes 3 and pixel electrode 2.

In an example, the array substrate further comprises a thin film transistor (TFT) disposed in the pixel area. A gate of TFT is disposed in the same layer as a gate line; a source and a drain of TFT are disposed in the same layer as the data line 1. The array substrate may further comprise a passivation layer, an active layer, etc., and no more details will be described here about this.

In the array substrate described above, the strip-shaped common electrodes are only disposed corresponding to the pixel electrode and no common electrodes is disposed over the data line, so that the coupling capacitance formed between strip-shaped common electrodes and the data line are reduced, and thus the loads on the data line are reduced, the power consumption is reduced; meanwhile the adverse impacts of the coupling capacitances on the display are reduced as well.

An embodiment of the present invention further provides a display panel comprising the array substrate provided in the foregoing embodiment.

In the display panel described above, the strip-shaped common electrodes are only disposed corresponding to the pixel electrode and no common electrodes is disposed over the data line, so that the coupling capacitance formed between strip-shaped common electrodes and the data line are reduced, and thus the loads on the data line are reduced, the power consumption is reduced; meanwhile the adverse impacts of the coupling capacitances on the display are reduced as well.

An embodiment of the present invention further provides a display device comprising the display panel provided in the foregoing embodiment. The display device may be any product or component with a display function, such as a liquid crystal panel, an electronic paper, an OLED panel, a liquid crystal television, a liquid crystal display, a digital picture frame, a cell phone, a tablet computer, etc.

In the display device described above, the strip-shaped common electrodes are only disposed corresponding to the pixel electrode and no common electrodes is disposed over the data line, so that the coupling capacitance formed between strip-shaped common electrodes and the data line are reduced, and thus the loads on the data line are reduced, the power consumption is reduced; meanwhile the adverse impacts of the coupling capacitances on the display are reduced as well.

What is described above is related to the illustrative implementations of the invention only and not limitative to the scope of the invention; the scopes of the invention are defined by the accompanying claims.

The present application is based on and claims priority of China patent application No. 201410140645.5 filed on Apr. 9, 2014, which is incorporated herein in its entirety by reference.

The invention claimed is:

1. An array substrate, comprising:
a plurality of pixel areas defined by a plurality of gate lines intersecting a plurality of data lines, wherein each pixel area comprises:
a pixel electrode;
a common electrode comprising strip-shaped common electrodes, wherein the strip-shaped common electrodes are configured to cooperate with the pixel electrode to generate electric fields;
an insulating layer disposed between the strip-shaped common electrodes and the pixel electrode; and
a resin layer disposed between the data line and the strip-shaped common electrodes;
wherein the strip-shaped common electrodes are disposed over the pixel electrode, orthographic projections of the strip-shaped common electrodes are non-overlapping with orthographic projections of the data lines in a plane of the array substrate, and an orthographic projection of the pixel electrode is non-overlapping with the orthographic projections of the data lines in the plane of the array substrate;
wherein a distance between two pixel electrodes which are nearest to and on both sides of the data line is smaller than a distance between two of the strip-shaped common electrodes which are nearest to and on both sides of the data line and is larger than a width of the data line;

wherein the pixel electrode is disposed in the insulating layer, the data line is disposed in the resin layer, and the insulating layer is disposed between the resin layer and the strip-shaped common electrodes, the data line and the pixel electrode are disposed in two different layers;

wherein no common electrode overlays the data lines and the orthographic projection of the common electrode are non-overlapping with the orthographic projections of the data lines in the plane of the array substrate.

2. The array substrate of claim 1, wherein the strip-shaped common electrodes extend in the same direction as the data line.

3. The array substrate of claim 2, wherein a distance between two of the strip-shaped common electrodes which are nearest to and on both sides of the data line is from 11 microns to 18 microns.

4. The array substrate of claim 2, wherein the strip-shaped common electrodes are arranged at equal intervals in each pixel area.

5. The array substrate of claim 1, wherein the distance between two of the strip-shaped common electrodes which are nearest to and on both sides of the data line is from 11 microns to 18 microns.

6. The array substrate of claim 5, wherein the strip-shaped common electrodes are arranged at equal intervals in each pixel area.

7. The array substrate of claim 1, wherein the strip-shaped common electrodes are arranged at equal intervals in each pixel area.

8. A display panel, comprising the array substrate of claim 1.

9. A display device, comprising the display panel of claim 8.

10. The display panel of claim 8, wherein the strip-shaped common electrodes extend in the same direction as the data line.

11. The display panel of claim 8, wherein a distance between two of the strip-shaped common electrodes which are nearest to and on both sides of the data line is from 11 microns to 18 microns.

12. The display panel of claim 8, wherein the strip-shaped common electrodes are arranged at equal intervals in each pixel area.

13. An array substrate, comprising:
a plurality of pixel areas defined by a plurality of gate lines intersecting a plurality of data lines;
a plurality of pixel electrodes each disposed in a pixel of the plurality of pixel areas;
a common electrode comprising strip-shaped common electrodes, wherein the strip-shaped common electrodes are configured to cooperate with pixel electrodes to generate electric fields;
an insulating layer disposed between the strip-shaped common electrodes and the plurality of pixel electrodes;
wherein the strip-shaped common electrodes are disposed over the pixel electrodes, orthographic projections of the strip-shaped common electrodes are non-overlapping with orthographic projections of the data lines in a plane of the array substrate;
wherein the orthographic projections of pixel electrodes are non-overlapping with the orthographic projections of the data lines in the plan of the array substrate;
wherein a distance between two pixel electrodes which are nearest to and on both sides of a data line is smaller than a distance between two of the strip-shaped common electrodes which are nearest to and on both sides of the data line;
wherein no common electrode overlays the data lines and the orthographic projection of the common electrode are non-overlapping with the orthographic projections of the data lines in the plane of the array substrate.

14. The array substrate of claim 13, wherein the strip-shaped common electrodes extend in the same direction as the data line.

15. The array substrate of claim 13, wherein the distance between two of the strip-shaped common electrodes which are nearest to and on both sides of the data line is from 11 microns to 18 microns.

16. The array substrate of claim 13, wherein the strip-shaped common electrodes are arranged at equal intervals in each pixel area.

17. The array substrate of claim 13, further comprising a resin layer disposed between the data line and the strip-shaped common electrodes.

18. The array substrate of claim 17, wherein both the data line and the pixel electrode are disposed in the insulating layer, and the resin layer is disposed between the insulating layer and the strip-shaped common electrodes.

19. The array substrate of claim 17, wherein the pixel electrodes are disposed in the insulating layer, the data line is disposed in the resin layer, and the insulating layer is disposed between the resin layer and the strip-shaped common electrodes.

20. The array substrate of claim 13, further comprising a thin film transistor (TFT) disposed in the pixel area, wherein a gate of the TFT is disposed in the same layer as a gate line, and a source and a drain of the TFT are disposed in the same layer as the data line.

* * * * *